United States Patent
Gomm et al.

(10) Patent No.: US 7,671,647 B2
(45) Date of Patent: Mar. 2, 2010

(54) APPARATUS AND METHOD FOR TRIMMING STATIC DELAY OF A SYNCHRONIZING CIRCUIT

(75) Inventors: Tyler Gomm, Boise, ID (US); Kang Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 91 days.

(21) Appl. No.: 11/341,774

(22) Filed: Jan. 26, 2006

(65) Prior Publication Data

US 2007/0171760 A1    Jul. 26, 2007

(51) Int. Cl.
*H03L 7/06* (2006.01)
(52) U.S. Cl. ...................................... 327/158; 327/175
(58) Field of Classification Search ................. 327/158, 327/175
See application file for complete search history.

(56) References Cited

U.S. PATENT DOCUMENTS

| | | | | |
|---|---|---|---|---|
| 4,341,999 A * | 7/1982 | Rudish et al. | ............... | 327/236 |
| 5,684,421 A * | 11/1997 | Chapman et al. | ........... | 327/261 |
| 6,191,627 B1 * | 2/2001 | Heyne | ....................... | 327/161 |
| 6,369,624 B1 | 4/2002 | Wang et al. | ................. | 327/156 |
| 6,429,715 B1 | 8/2002 | Bapat et al. | ................. | 327/295 |
| 6,448,820 B1 | 9/2002 | Wang et al. | .................... | 327/12 |
| 6,556,643 B2 * | 4/2003 | Merritt | ........................ | 377/16 |
| 6,642,758 B1 | 11/2003 | Wang et al. | ................. | 327/156 |
| 6,704,881 B1 | 3/2004 | Li et al. | ...................... | 713/401 |
| 6,972,998 B1 | 12/2005 | Gibson et al. | .......... | 365/189.05 |
| 7,034,596 B2 | 4/2006 | Andrews et al. | ............ | 327/257 |
| 7,038,511 B2 * | 5/2006 | Kim et al. | .................... | 327/158 |
| 7,078,950 B2 * | 7/2006 | Johnson | ...................... | 327/158 |
| 2005/0010713 A1 | 1/2005 | Neuman et al. | ................ | 711/1 |
| 2005/0190193 A1 | 9/2005 | Freker et al. | ................ | 345/534 |
| 2006/0017480 A1 | 1/2006 | Lin | ............................. | 327/158 |

* cited by examiner

*Primary Examiner*—Kenneth B. Wells
(74) *Attorney, Agent, or Firm*—Dorsey & Whitney LLP

(57) ABSTRACT

A system and method for trimming an unadjusted forward delay of a delay-locked loop (DLL) and trimming a duty cycle of first and second output clock signals provided by a DLL. For trimming an unadjusted forward delay, delay is added to one of a feedback clock signal path and an input clock signal path and a feedback clock signal is provided from the feedback clock signal path and an input clock signal is provided from the input clock signal path for phase comparison. For trimming a duty cycle of first and second output clock signals, one of a first delayed input clock signal and a second delayed input clock signal is delayed. The first and second delayed input clock signals are complementary. The delayed clock signal and the other clock signal are provided as the first and second output clock signals.

17 Claims, 7 Drawing Sheets

APPARATUS AND METHOD FOR TRIMMING STATIC DELAY OF A SYNCHRONIZING CIRCUIT

TECHNICAL FIELD

The present invention is directed to memory and other electronic devices employing synchronizing circuits, such as delay-locked loops, and more particularly, to circuits that provide trimming of a non-adjusted delay path of a synchronizing circuit.

BACKGROUND OF THE INVENTION

In synchronous integrated circuits, the integrated circuit is clocked by an external clock signal and performs operations at predetermined times relative to the rising and falling edges of the applied clock signal. Examples of synchronous integrated circuits include synchronous memory devices such as synchronous dynamic random access memories ("SDRAMs"), synchronous static random access memories ("SSRAMs"), and packetized memories like SLDRAMs and RDRAMs, and include other types of integrated circuits as well, such as microprocessors. The timing of signals external to a synchronous memory device is determined by the external clock signal, and operations within the memory device are typically synchronized to external operations. For example, data is read from the memory device in synchronism with the external clock signal. To provide the data at the proper times, an internal clock signal is developed in response to the external clock signal, and is typically applied to latches contained in the memory device to clock the data into the latches. The internal clock signal and external clock must be synchronized to ensure the internal clock signal clocks the latches at the proper times to successfully provide the data. In the present description, "external" refers to signals and operations outside of the memory device, and "internal" refers to signals and operations within the memory device. Moreover, although the present description is directed to synchronous memory devices, the principles described herein are equally applicable to other types of synchronous integrated circuits.

Internal circuitry in the memory device that generates the internal clock signal necessarily introduces some time delay, causing the internal clock signal to be phase shifted relative to the external clock signal. As long as the phase-shift is minimal, timing within the memory device can be easily synchronized to the external timing. As used herein, the term synchronized includes signals that are coincident and signals that have a desired delay relative to one another. However, with higher frequency clock signals, the time delay introduced by the internal circuitry becomes more significant. This is true because as the frequency of the external clock signal increases, the period of the signal decreases and thus even small delays introduced by the internal circuitry correspond to significant phase shifts between the internal and external clock signals. As a result of intrinsic delays, the data provided by the memory device may not be valid at the time the internal clock signal clocks the latches.

Additionally, as the frequency of the external clock increases, variations in the duty cycle of the clock signal introduce a greater duty cycle error. An ideal duty cycle for a clock signal is typically 50 percent. That is, over the period of a clock cycle, the clock signal is HIGH for 50 percent of the period. As the period of the clock signals become shorter due to the increased clock frequency, a clock variation that results in a subtle shift in duty cycle, and which can be ignored at a lower clock frequency, may result in a much more significant shift in the duty cycle of the higher frequency clock signal. In such instances, if the duty cycle of the clock signal is left uncorrected, timing errors may cause the memory device to fail.

To synchronize external and internal clock signals in modern synchronous memory devices, a number of different approaches have been considered and utilized, including delay-locked loops ("DLLs") with duty cycle correction ("DCC") circuits. Clock synchronizing circuits, such as DLLs, generate output clock signals that are in phase, or synchronized, with input clock signals. A DCC circuit can correct a distorted duty cycle of clock signals. One DCC technique takes a first clock signal and a second clock signal that is 180 degrees out of phase from the first clock signal and shifts the phase of one of the two clock signals so that rising edges of the first and second clock signals correspond to rising edges of two clock signals having ideal 50 percent duty cycles. Although the clock signals still appear distorted, circuitry operating in response to rising edges of the first and second clock signals will function as if provided with clock signals having 50 percent duty cycles.

FIG. 1 illustrates a DLL 100. The DLL 100 operates in a conventional manner, with it providing delayed output clock signals DCLK0 and DCLK180 that are in phase with input clock signals CLK0 and CLK180, respectively. The CLK0 and CLK180 signals are 180 degrees out-of-phase, as are the DCLK0 and DCLK180 signals. Operation of the DLL 100 will be described ignoring operation of the tAC trim and tOH trim circuits 140, 150, the operation of which will be described in detail below. The CLK0 and CLK180 signals are buffered by input buffer circuits 102, 104 and provided to a variable delay line 106. The variable delay line 106 delays the CLK0 and CLK180 signals by a delay controlled by a phase detector 110. The delayed CLK0 and CLK180 signals are buffered by output clock buffer circuit 112, 114. The delayed CLK0 signal output by the variable delay line 106 is further delayed by a model delay 108 having a delay equal to the total intrinsic delay of the input and output buffer circuits 102, 104 and 112, 114. The phase detector 110 receives and compares the phase of the buffered CLK0 signal and a CLKFB signal output by the model delay 108. Based on the phase of the two signals, the variable delay line 106 is adjusted until the buffered CLK0 signal and the CLKFB signal are in phase. Under this condition, the DLL is described as being "locked" and the resulting DCLK0 and DCLK180 signals will be in phase (i.e., "synchronized") with the CLK0 and CLK180 signals.

The variable delay line 106 has a range of adjustable delay between a minimum delay and a maximum adjustable delay. In order to accommodate a wide range of input clock frequencies and variations in circuit performance that can result from manufacturing variations, it is desirable for the variable delay line 106 to have a wide range of adjustable delay. Providing such an adjustable delay circuit, however, requires a considerable number of delay stages. This results in a relatively "large" circuit that consumes significant power. Additionally, typical delay stages include delay circuits having respective delays that are affected by electrical noise, such as power noise. As a result, an input clock signal that propagates through a long chain of delay stages is more susceptible to "clock jitter" since the delay of each stage is affected by electrical noise and the total noise-induced shift in delay is additive over the entire length of delay stages. Thus, the range of adjustable delay that an adjustable delay is designed to provide is a compromise between providing sufficient delay to accommodate an acceptable range of clock and account for variations in circuit performance, and the desire to reduce circuit size, power consumption and susceptibility to noise-induced clock jitter.

With the range of adjustable delay of the variable delay line 106 tailored to balance competing considerations, it may be necessary to trim a static or non-adjusted delay of the DLL 100 due to a mismatch between the model delay 108 and the actual delay of the input buffer circuits 102, 104 and the output clock buffer circuits 112, 114. The static delay of the DLL 100 for tAC is generally represented by the variable delay line 106, but set to a default delay, and the model delay 108. The static delay of the DLL 100 for tOH is generally represented by the default delay of the variable delay line. The tAC and tOH trim circuits 140, 150 provide examples of this trimming functionality. The tAC trim circuit 140 is used to trim static clock synchronization accuracy and the tOH trim circuit 150 is used to trim static duty cycle. The tAC trim circuit 140 includes a static delay circuit 120 that provides a fixed delay and further includes an adjustable delay 122 having a delay that is adjusted by a trim decoder circuit 124. The trim decoder circuit 124 receives a tAC trim signal that is used to set the amount of delay trim for the tAC trim circuit 140. The tOH trim circuit 150 similarly includes a static delay circuit 130 and an adjustable delay circuit 132 that has a delay that can be adjusted by a tOH trim decoder 134. A tOH trim signal is used to set the desired delay trim of the tOH trim circuit 150. The tAC and tOH trim signals are typically determined during testing of the memory device where its performance is measured and compared to performance specifications. Where the memory device is not performing to tAC and tOH specifications, trim signals suitable to correct the deviations are generated and applied accordingly.

FIG. 2 illustrates the static delay 120, 130 and the adjustable delay 122, 132 of the tAC and tOH trim circuits 140, 150. In the case of the tAC trim circuit, the CLK0 and CLKFB signals are provided to the static delay 120 and the adjustable delay 122 to produce the delayed output signals CLK0_trim and CLKFB_trim signals, all respectively. As for the tOH trim circuit, CLK0VD and CLK180VD output by the variable delay 106 are further delayed by the static delay 130 and the adjustable delay 132 to provide CLK0VD_trim and CLK180VD_trim signals, all respectively. The adjustable delay 122, 132 provides a range of adjustable delay between a minimum delay, typically an intrinsic delay 204 and a maximum delay. The tAC/tOH trim decoder 124, 134 adjusts the delay of the adjustable delay 122, 132 according to a respective trim signal. The default delay of the adjustable delay 122, 132 is typically one-half of the maximum delay. The static delay circuit 120, 130 has an intrinsic delay 202 and also provides a fixed delay that is approximately one-half of the maximum delay of the adjustable delay 122, 132.

By providing a static delay circuit 120, 130 of one-half of the maximum delay and an adjustable delay 122, 132, the phase of a first clock signal can be shifted in time in either the positive or negative direction relative to the phase of a second clock signal. That is, the first clock signal and be shifted earlier or later in time relative to the second clock signal. For example, with particular reference to the CLK0 and CLKFB signals, assume that in an initial condition the CLK0 and CLKFB signals are in phase and the adjustable delay 122 is set to provide the same delay as the static delay circuit 120 (i.e., one-half the maximum adjustable delay). The CLKFB_trim signal can be shifted earlier in time relative to the CLK0_trim signal by adjusting the adjustable delay 122 to provide less delay than the static delay circuit 120 (i.e., less than one-half the maximum adjustable delay). Conversely, the CLKFB_trim signal can be shifted later in time relative to the CLK0_trim signal by adjusting the adjustable delay 122 to provide more delay than the static delay circuit 120 (i.e., more than one-half the maximum adjustable delay). Shifting the CLKFB_trim signal relative to the CLK0_trim signal can be used to trim tAC since the phase detector 110 (FIG. 1) will adjust the variable delay line 106 according to the phase relationship of the CLK0_trim and CLKFB_trim signals. Where the tAC specifications are not met, the CLKFB_trim signal can be shifted either earlier or later in time relative to the CLK0_trim signal so that the synchronization of the CLK0_trim and CLKFB_trim signals by the variable delay line 106 is possible. As previously discussed, such a situation can occur due to variations in the fabrication process of the memory device or due to timing differences between the real clock path and that of the clock path including the model delay 108.

The tOH trim circuit 150 operates in a manner similar to the tAC trim circuit. A DCC circuit (not shown) can precisely adjust the phases of the DCLK0 and DCLK180 signals to provide rising clock edges corresponding to an ideal 50% duty cycle. However, the DCLK0 and DCLK180 signals should be in a correctible range of the DCC circuit. The tOH trim circuit 150 can be used to adjust the phases of the DCLK0 and DCLK180 signals so that a distorted duty cycle outside of the correctible range can be corrected by the DCC. The tOH trim circuit can shift the phase of the CLK180VD_trim signal to an earlier or later time relative to the CLKVD0_trim signal. For a duty cycle that is too low for correction by the DCC circuit, the adjustable delay 132 can be set to provide more delay than the static delay circuit 130 in order to "increase" the duty cycle so that it can be corrected. For a duty cycle that is too high for correction by the DCC circuit, the adjustable delay 132 can be set to provide less delay than the static delay circuit 130 in order to "decrease" the duty cycle so that it can be corrected.

Although the tAC and tOH trim circuits 140, 150 can provide adjustability for trimming tAC and tOH, the static delay circuit 120, 130 necessarily adds a delay of one-half the maximum adjustable delay of the adjustable delay 122 to the CLK0 and CLK0VD signals, even if tAC and tOH trimming is unnecessary. In the cases where tAC and tOH trimming are required, the delay of the adjustable delay 122, 132 will typically be centered around the default setting of one-half of its maximum adjustable delay. Thus, in either case, both the CLK0, CLKFB and CLK0VD, CLK180VD signals will necessarily be delayed. As previously discussed, adding delay increases susceptibility to noise-induced jitter and also presents the possibility of increased power consumption. In applications where having precision clock signals and relatively low power consumption are both desirable, the costs associated with conventional delay trimming circuits may be unacceptable.

Therefore, there is a need for a delay trimming circuit that can trim delays using less forward delay, and as a result, is less susceptible to noise-induced clock jitter and has lower power consumption.

SUMMARY OF THE INVENTION

One aspect of the invention provides a clock signal generator circuit having a delay-locked loop (DLL) and a trimming circuit for trimming an unadjusted forward delay of the DLL. The delay-locked loop (DLL) includes a DLL adjustable delay and a phase detector. The DLL adjustable delay is operable to provide a delayed clock signal in response to an input clock signal. The phase detector is operable to compare first and second signals and is further operable to adjust the delay of the DLL adjustable delay based on the phase of the first and second signals. The trimming circuit includes first and second adjustable delays and is operable to delay the input clock signal and a feedback clock signal, respectively, by respective adjustable delays to provide the first and second signals to the phase detector. The feedback clock signal is related to the delayed clock signal provided by the DLL adjustable delay.

Another aspect of the invention provides a clock signal generator circuit having a delay-locked loop (DLL) and a trimming circuit for trimming an uncorrected duty cycle. The DLL includes a DLL adjustable delay and a phase detector. The DLL adjustable delay is operable to provide a first delayed clock signal in response to a first input clock signal and is further operable to provide a second delayed clock signal in response to second input signal. The first and second input clock signals are complementary. The phase detector is operable to compare first and second signals and is further operable to adjust the delay of the DLL adjustable delay based on the phase of the first and second signals. The trimming circuit includes first and second adjustable delays and is operable to trim an uncorrected duty cycle by delaying the first and second delayed clock signals, respectively, provided by the DLL adjustable delay by respective adjustable delays to provide first and second output clock signals. The first input clock signal and the first output clock signal are provided to the phase detector as the first and second signals.

Another aspect of the invention provides a method for trimming an unadjusted forward delay of a delay-locked loop (DLL). The method includes adding delay to one of a feedback clock signal path and an input clock signal path and providing a feedback clock signal from the feedback clock signal path and an input clock signal from the input clock signal path for phase comparison.

Another aspect of the invention provides a method for trimming a duty cycle of first and second output clock signals provided by a delay-locked loop (DLL). The method includes delaying one of a first delayed input clock signal and a second delayed input clock signal. The first and second delayed input clock signals are complementary. The delayed clock signal and the other clock signal are provided as the first and second output clock signals.

DETAILED DESCRIPTION OF PREFERRED EMBODIMENTS

Certain details are set forth below to provide a sufficient understanding of the invention. However, it will be clear to one skilled in the art that the invention may be practiced without these particular details. Moreover, the particular embodiments of the present invention described herein are provided by way of example and should not be used to limit the scope of the invention to these particular embodiments. In other instances, well-known circuits, control signals, and timing protocols have not been shown in detail in order to avoid unnecessarily obscuring the invention.

Figure 1:
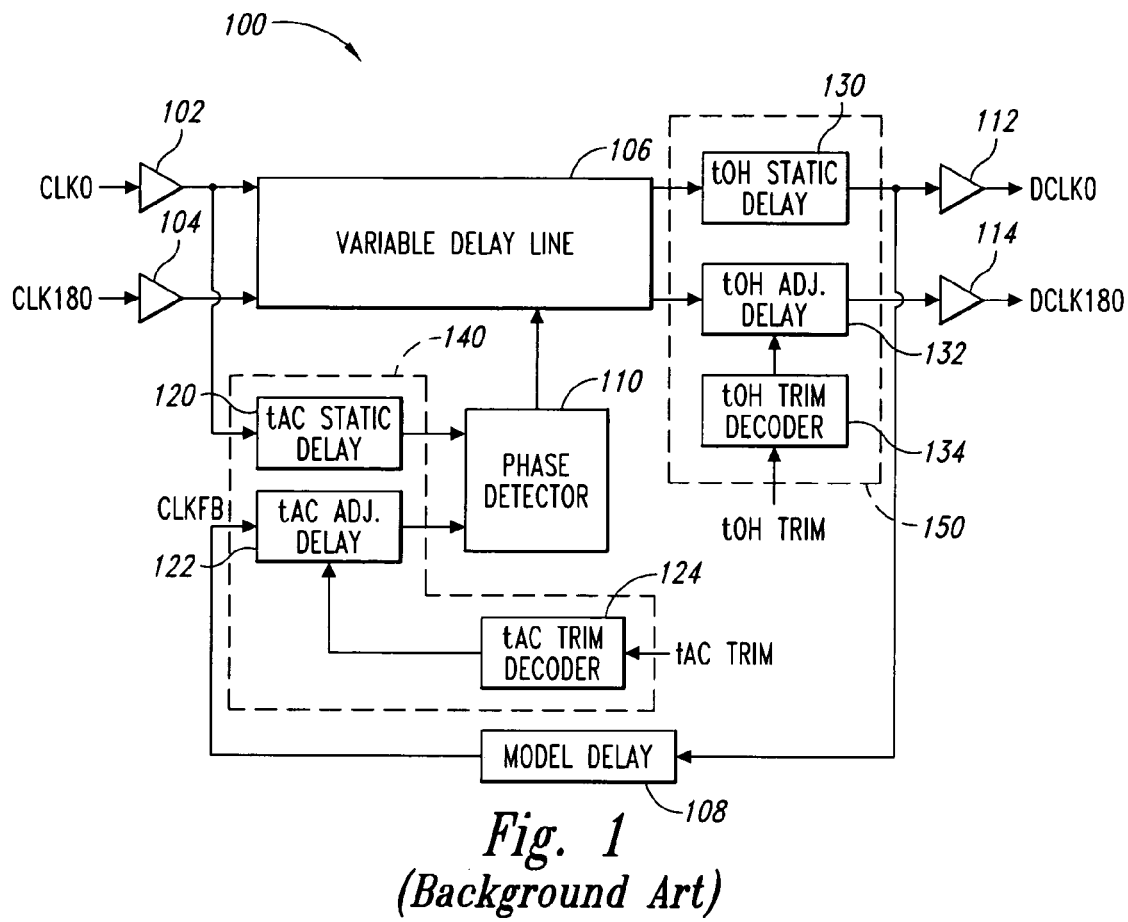
FIG. 1 is a functional block diagram of a DLL having conventional tAC trim and tOH trim circuits.
Figure 2:
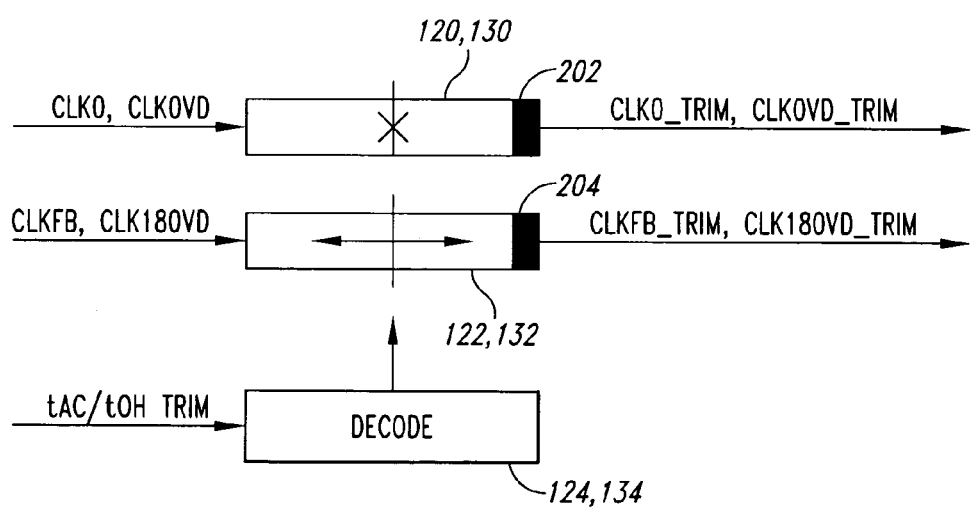
FIG. 2 is a block diagram of the tAC trim and tOH trim circuits of FIG. 1.
Figure 3:
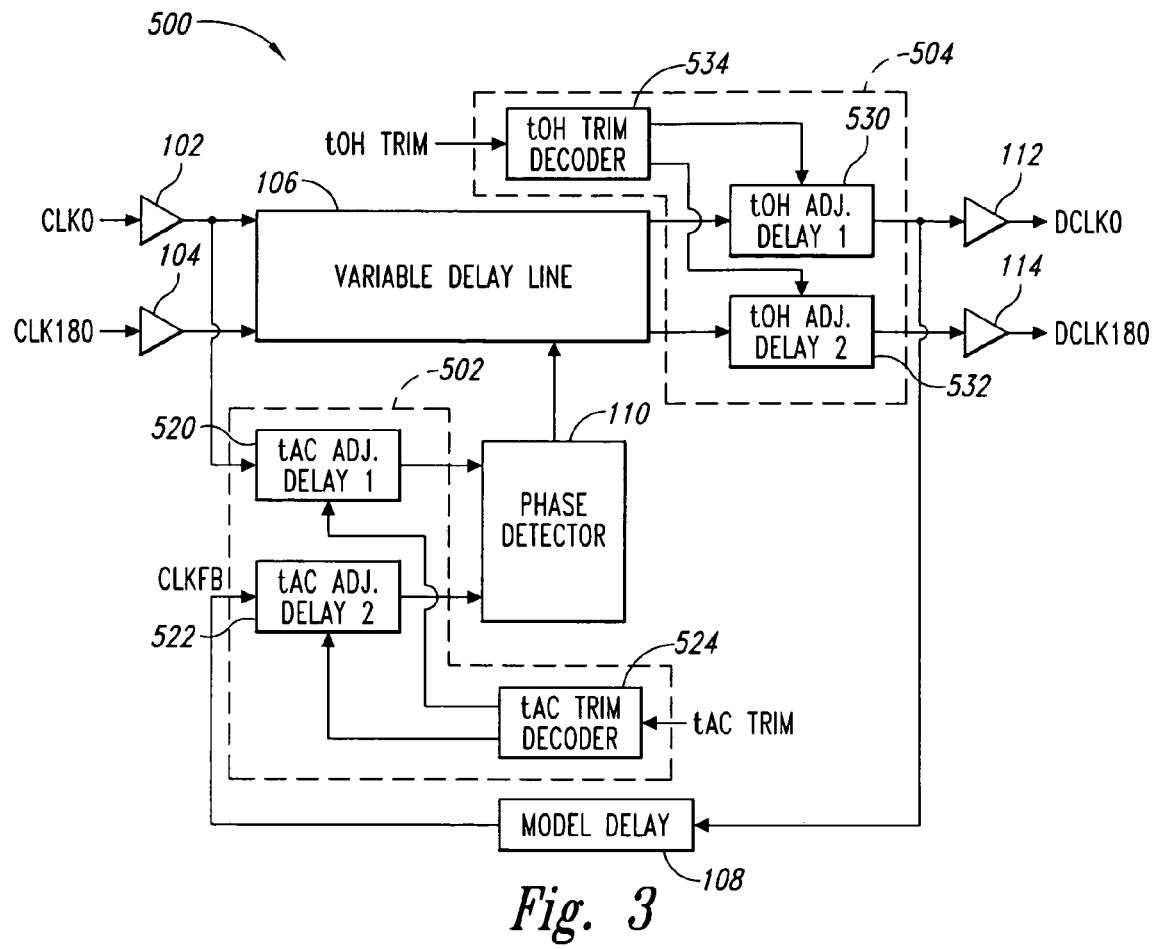
FIG. 3 is a functional block diagram of a DLL having a tAC trim circuit and tOH trim circuit according to embodiments of the present invention.

FIG. 3 illustrates a DLL 500 having tAC trim circuit 502 and tOH trim circuit 504 according to embodiments of the present invention. The tAC trim circuit 502 is used to adjust static clock synchronization accuracy and the tOH trim circuit 504 is used to adjust static duty cycle. Elements previously discussed with respect to the DLL 100 have been labeled in FIG. 3 using the same reference numbers as in FIG. 1. The tAC trim circuit 502 and tOH trim circuit 504 can be included separately in a DLL in alternative embodiments of the present invention, as opposed to including both, as shown in FIG. 3 for the DLL 500. The tAC trim circuit 502 will be described first, followed by a description of the tOH trim circuit 504.

The tAC trim circuit 502 includes first and second adjustable delays 520, 522. The first adjustable delay 520 provides a delayed output clock signal CLK0_trim to a phase detector 110 that compares the phase with the phase of an output clock signal CLKFB_trim provided by the second adjustable delay 522. A tAC trim decoder 524 adjusts the delay of the first and second adjustable delays 520, 522 according to a tAC trim signal tAC trim. As previously discussed, the tAC trim signal is indicative of an amount of tAC trimming that brings the phase relationship between the CLK0 and CLKFB signals to within a range that can be accommodated by a variable delay line 106 in order to provide DCLK0, DCLK180 signals that are synchronized with the CLK0, CLK180 signals, respectively.

Figure 4:
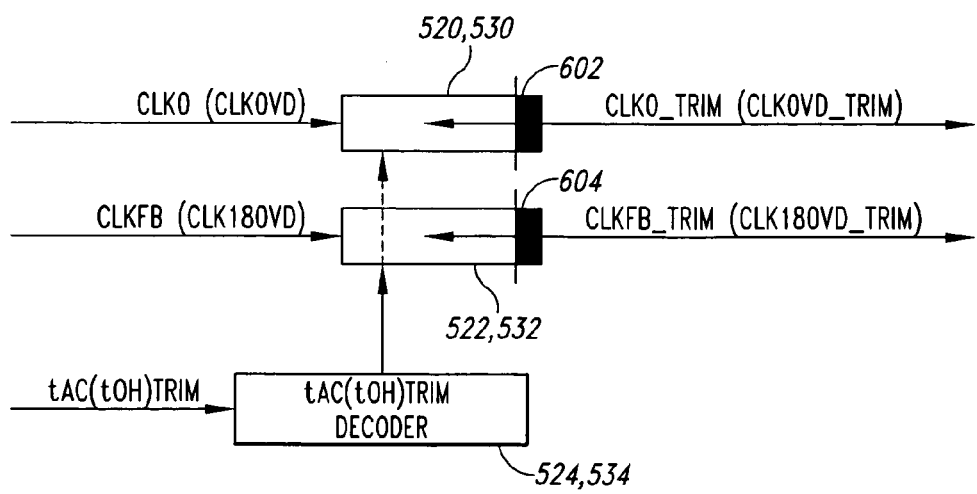
FIG. 4 is a block diagram of the tAC trim circuit and the tOH trim circuit of FIG. 3.

In contrast to conventional tAC trim circuits, the tAC trim circuit 502 can provide adjustable delay for both the CLK0 signal and the CLKFB signal, as opposed to having a static delay for one clock signal and an adjustable delay for the other clock signal. FIG. 4 illustrates the CLK0, CLKFB signals and the CLK0_trim, CLKFB_trim signals provided by the adjustable delays 520, 522. The adjustable delays 520, 522 are adjusted by the tAC trim decoder 524 in accordance with the tAC trim signal. As shown, the adjustable delays 520, 522 have intrinsic delays 602, 604 that are added to the CLK0 and CLKFB signals even when the delay is adjusted to a minimum. the intrinsic delay, however, is a nominal delay and, since it is added to both the CLK0 and CLKFB signals, does not change the relative phase relationship.

Adding delay to either or both the CLK0 and CLKFB signals can provide the same range of positive and negative adjustability as conventional tAC trim circuit 140, but with the benefit of reducing the forward delay path of the CLK0 and CLKFB signals. Minimizing the delay added to either signal can minimize susceptibility to noise-induced clock jitter. As previously described, the conventional tAC trim circuit 140 includes a static delay 120 that necessarily adds one-half of a maximum adjustable delay to the CLK0 signal. Delay is also added to the CLKFB signal through the adjustable delay 122 in order to adjust the phase relationship between the CLK0 and CLKFB signals. In contrast, however, with the tAC trim circuit 502, the forced delay added to the CLK0 signal can be eliminated and the requisite delay added to either the CLK0 or CLKFB signals to provide sufficient tAC trim can be minimized. As will be explained in more detail below, one of the delays 520, 522 of the tAC trim circuit 502 can be set to a minimum delay while the other delay is set to provide sufficient delay to adequately trim tAC.

Figure 5A:
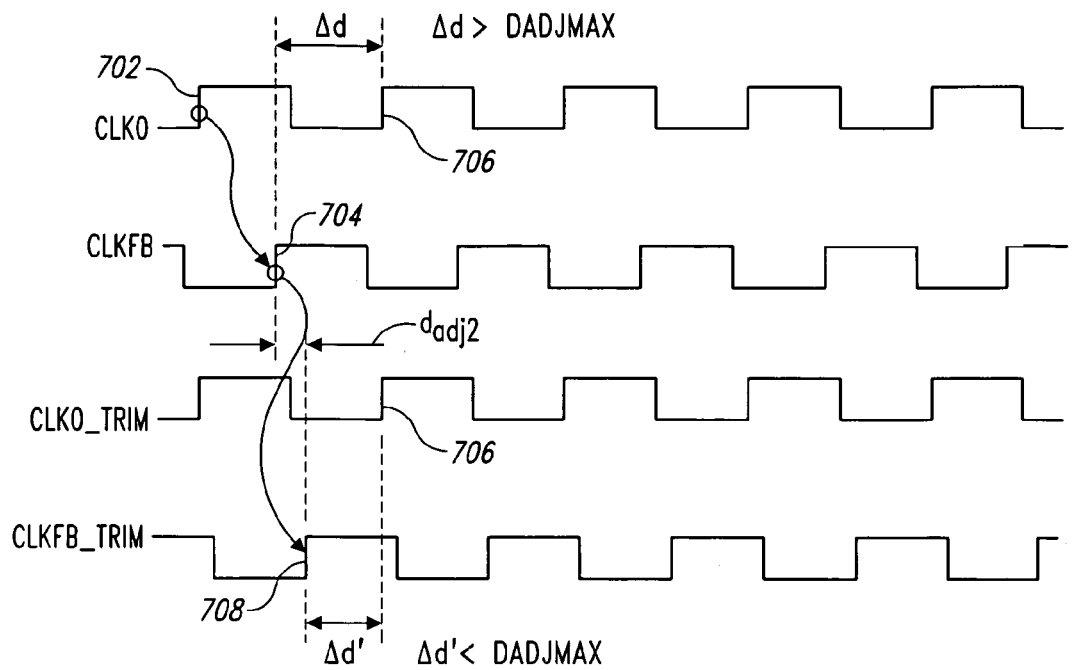
FIGS. 5A and 5B are timing diagrams of various clock signals during operation of the tAC trim circuit of FIG. 3.
Figure 5B:
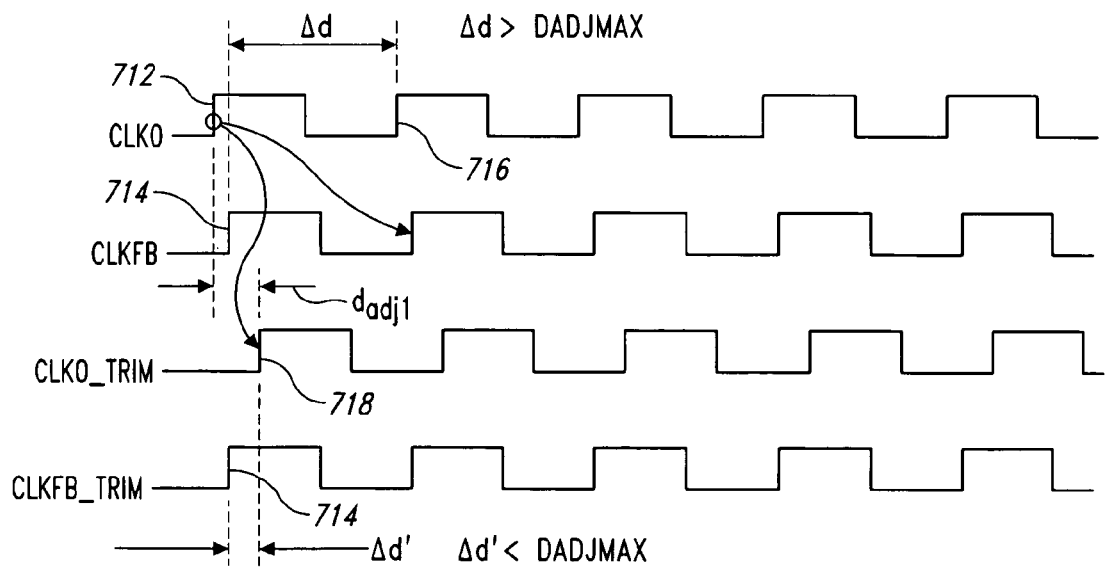

Operation of the tAC trim circuit 502 will be described with reference to the timing diagrams of FIGS. 5A and 5B. The timing diagram of FIG. 5A illustrates a situation where the forward delay through the variable delay line 106 and the model delay 108 is less than expected (ignoring the delays of the tOH trim circuit 504 for the present explanation). The timing diagram of FIG. 5B illustrates a situation where the forward delay through the variable delay line 106 and the model delay 108 is greater than expected. Such variations can result from variations in the fabrication process.

In the situation illustrated in FIG. 5A, it is desirable to trim tAC by shifting CLKFB later in time relative to the CLK0 signal so that the range of adjustable delay of the variable delay line 106 can be used to synchronize the CLK0 and CLKFB signals. This is achieved by adjusting the adjustable delays 520, 522 to add delay the CLKFB signal relative to the CLK0 signal. The CLKFB signal is a delayed version of the CLK0 signal delayed by the delay of the variable delay line 106 and the delay of the model delay 108. This is shown by rising edge 702 which results in rising edge 704 of the CLKFB signal. In order to synchronize the CLKFB signal to the CLK0 signal, that is, match the rising edge 704 of the CLKFB signal to rising edge 706 of the CLK0 signal, thereby synchronizing the CLK0 signal to the DCLK0 signal, a delay of $\Delta d$ will need to be added by the variable delay line 106. However, the required $\Delta d$ is greater than the maximum adjustable delay DADJMAX of the variable delay line 106. Additionally, as previously noted there may be static error in the model delay 108 which can be compensated by trimming. Without trimming tAC, the DLL 500 cannot achieve an accurately locked condition (i.e., model delay error). In order to trim the tAC such that the $\Delta d$ is in the adjustable delay range of the variable delay line 106 or to compensate for model delay error, the delay 522 of the tAC trim circuit 502 is adjusted to delay the CLKFB signal relative to the CLK0 signal. A delay dadj2 is added to the CLKFB signal to provide the CLKFB_trim signal and no delay is added to the CLK0 signal (intrinsic delay of the adjustable delay 520 is ignored in FIG. 5A) to provide the CLK0_trim signal. As a result, a rising edge 708 of the CLKFB_trim signal can be synchronized to the rising edge 706 of the CLK0_trim signal (same as the rising edge for the CLK0 signal since no delay was added by the adjustable delay 520) by providing a delay $\Delta d'$. The delay $\Delta d'$, which is less than $\Delta d$ for an untrimmed tAC, is within the range of adjustable delay of the variable delay line 106. Consequently, under normal operation of the DLL 500, the delay of the variable delay line 106 will be adjusted accordingly by the phase detector 110, which receives the CLK0_trim and CLKFB_trim signals, in order to achieve a locked condition.

In the situation illustrated in FIG. 5B, it is desirable to trim tAC by shifting CLKFB earlier in time relative to the CLK0 signal so that the range of adjustable delay of the variable delay line 106 can be used to synchronize the CLK0 and CLKFB signals. This is achieved by adjusting the adjustable delays 520, 522 to add delay to the CLK0 signal relative to the CLKFB signal. In order to synchronize the CLK0 and CLKFB signals, a delay of $\Delta d$ is required. Under this condition, rising edge 714 of the CLKFB signal will be in phase with rising edge 716 of the CLK0 signal. However, $\Delta d$ is greater than the maximum adjustable delay DADJMAX of the variable delay line 106 or a static model delay error is present. Without trimming tAC, the DLL 500 cannot achieve an accurately locked condition.

In order for the delay $\Delta d$ to be within the adjustable delay range of the variable delay line 106 or to compensate for the static model error, the tAC is trimmed by adjusting the delay 520 of the tAC trim circuit 502 to delay the CLK0 signal relative to the CLKFB signal. A delay dadj1 is added to the CLK0 signal to provide the CLK0_trim signal. No delay is added to the CLKFB signal (intrinsic delay of the adjustable delay 522 is ignored in FIG. 5B) to provide the CLKFB_trim signal. As a result, the rising edge 714 of the CLKFB_trim signal (same as the rising edge for the CLKFB signal since no delay was added by the adjustable delay 522) can be synchronized to rising edge 718 of the CLK0_trim signal by providing a delay $\Delta d'$. The delay $\Delta d'$, which is less than $\Delta d$ for an untrimmed tAC, is within the range of adjustable delay of the variable delay line 106. Thus, under normal operation of the DLL 500, the delay of the variable delay line 106 will be adjusted accordingly by the phase detector 110, which receives the CLK0_trim and CLKFB_trim signals, in order to achieve a locked condition.

As illustrated by the previous examples, tAC trimming can be accomplished without forcing a delay for both the CLK0 and CLKFB signals. Delay is added to one of the signals, while the other signal is not delayed. The forward delay that is added to the CLK0 and CLKFB signals is consequently reduced compared to the conventional tAC trim circuit 140. In the case where no tAC trimming is necessary, both the adjustable delays 520, 522 are set to a minimum delay. In contrast, as previously explained, this same condition would nevertheless result in one-half a maximum adjustable delay being added to both CLK0 and CLKFB. As a result of the reduced forward delay, susceptibility to noise-induced clock jitter is reduced and total power is also reduced.

Turning to the tOH trim circuit 504 (FIG. 3), first and second adjustable delays 530, 532 provide adjustable delays to CLK0VD and CLK180VD signals output by the variable delay line 106. A tOH trim decoder 534 adjusts the delays of the adjustable delays 530, 532 in accordance with a tOH trim signal that is indicative of a desired amount of tOH trim. As with the tAC trim circuit 502 previously described, the tOH circuit can provide a same range of delay as the conventional tOH trim circuit 150, but with reduced forward delay. Rather than having a static delay line that necessarily adds one-half a maximum adjustable delay to one clock signal and further having an adjustable delay that adds delay to the other clock signal, the tOH trim circuit 504 can provide adjustable delay to either or both the CLK0VD or CLK180VD signals through adjustable delays 530, 532. In this manner, the forward delay that is added to either or both clock signals is minimized, and consequently, minimizes noise-induced clock jitter. FIG. 4 illustrates the adjustable delays 530, 532 and the tOH trim decoder 532. As with the adjustable delays 520, 522 of the tAC trim circuit 502, intrinsic delays are present, but are nominal and do not change the phase relationship between the CLK0VD and CLK180VD signals since the intrinsic delays are equal and added to both delay paths.

Figure 6A:
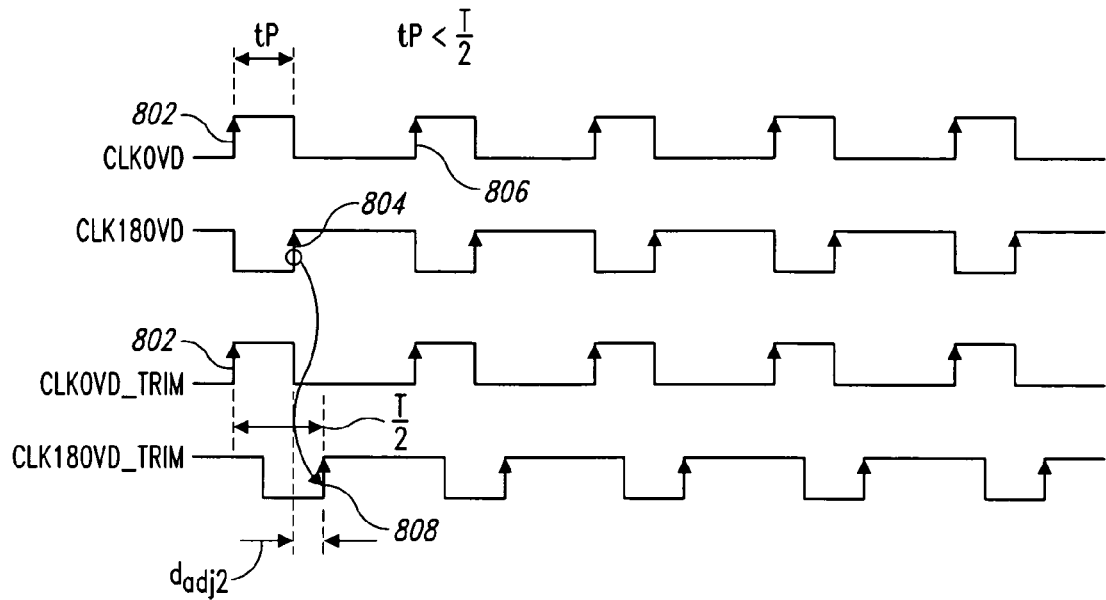
FIGS. 6A and 6B are timing diagrams of various clock signals during operation of the tOH trim circuit of FIG. 3.
Figure 6B:
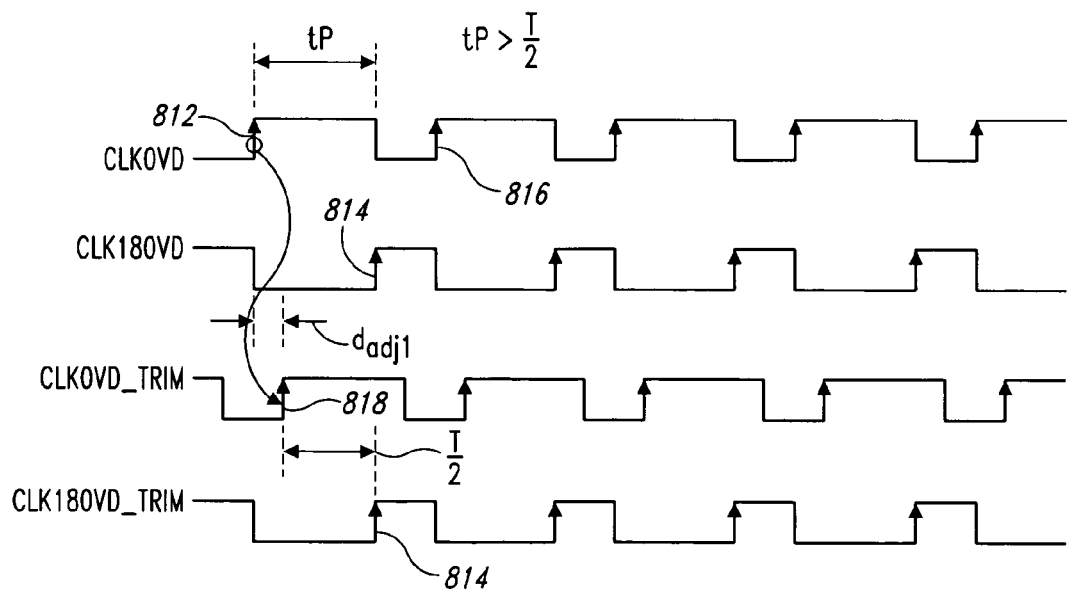

Operation of the tOH trim circuit will be described with reference to the timing diagrams of FIGS. 6A and 6B. FIG. 6A illustrates the situation where the CLK0 signal, and consequently the CLK0VD signal, has a duty cycle that is less than 50 percent. FIG. 6B illustrates the situation where the CLK0 and CLK0VD signals have duty cycles that are greater than 50 percent.

With reference to FIG. 6A, the CLK0VD and CLK180VD signals are shown to be in phase, but have non-ideal duty cycles. In order to reduce the duty cycle distortion of the CLK0VD and CLK180VD signals, the tOH is trimmed to change the relative phase relationship of the two clock signals. As previously discussed, FIG. 6A illustrates a CLK0VD signal having a duty cycle less than 50 percent. That is, with a clock period T defined between rising edges 802 and 806 of the CLK0VD signal, a rising edge 804 of the CLK180VD signal occurs at a time tP that is less than one-half of the period T. In order to reduce the duty cycle distortion, the CLK180VD signal should be delayed relative to the CLK0VD signal. This is accomplished by adjusting the delay of the adjustable delay 532 to provide a delay sufficient to shift a rising edge of the CLK180VD signal to a "later" time relative to the rising edge 802. To provide an ideal duty cycle, the adjustable delay 532 is adjusted to delay the CLK180VD signal by dadj2 to provide a CLK180VD_trim signal, shown in FIG. 6A. The rising edge 804 of the CLK180VD signal is delayed to provide a rising edge 808 of the CLK180VD_trim signal. To minimize the forward delay of the CLK0VD signal, the adjustable delay 530 is set to its minimum delay. The effect of any intrinsic delay 602 of the adjustable delay 530 is ignored in FIG. 6A, and the rising edge 802 of the CLK0VD signal results in the same rising edge for the CLK0VD_trim signal. As shown in FIG. 6A, by adding a delay of dadj2 to the CLK180VD signal, the rising edge 808 of the resulting CLK180VD_trim signal occurs at a time T/2 relative to the rising edge 802 of the CLK0VD_trim signal to provide an ideal duty cycle. The CLK0VD_trim and CLK180VD_trim signals are provided to the output buffers 112, 114, which add equal intrinsic delays to the respective clock signals, and are then output as the DCLK0 and DCLK180 signals, respectively.

As previously discussed, FIG. 6B illustrates a CLK0VD signal having a duty cycle that is greater than 50 percent. With the clock period T defined between rising edges 812 and 816 of the CLK0VD signal, rising edge 814 occurs at a time tP following the rising edge 812 that is greater than one-half of the period T. In order to reduce the duty cycle distortion, the CLK0VD signal should be delayed relative to the CLK180VD signal. This is accomplished by adjusting the delay of the adjustable delay 530 to provide a delay that shifts the rising edge 812 of the CLK0VD signal to a "later" time relative to the rising edge 814 of the CLK180VD signal. To provide an ideal duty cycle, the adjustable delay 530 is adjusted by the tOH trim decoder 534 to delay the CLK0VD signal by dadj1 to provide a CLK0VD_trim signal, shown in FIG. 6B. The rising edge 812 of the CLK0VD signal is delayed to provide a rising edge 818 of the CLK0VD_trim signal. To minimize the forward delay of the CLK180VD signal, the adjustable delay 532 is set to its minimum delay. The effect of any intrinsic delay 604 of the adjustable delay 532 is ignored in FIG. 6B, and the rising edge 814 of the CLK180VD signal results a rising edge of the CLK180VD_trim signal that occurs at the same time. As shown in FIG. 6B, by adding a delay of dadj1 to the CLK0VD signal, the rising edge 818 of the resulting CLK0VD_trim signal occurs at a time T/2 relative to the rising edge 814 of the CLK180VD_trim signal to provide an ideal duty cycle. The CLK0VD_trim and CLK180VD_trim signals are provided to the output buffers 112, 114, which add equal intrinsic delays to the respective clock signals, and are then output as the DCLK0 and DCLK180 signals, respectively.

Although FIGS. 6A and 6B illustrate trimming tOH to provide an ideal duty cycle, this was provided by way of example. Typically, the tOH is trimmed to place the duty cycle in a range of duty cycles that can be corrected by a DCC circuit (not shown in FIG. 3). As previously discussed, variations in circuit performance can result from fabrication process variations. In order to provide circuits that perform within specifications, it may be necessary to trim tOH. The tOH trim circuit 504 provides tOH trimming by adding minimal forward delays to either or both the CLK0VD and CLK180VD signals in order to reduce power supply induced jitter.

Figure 7:
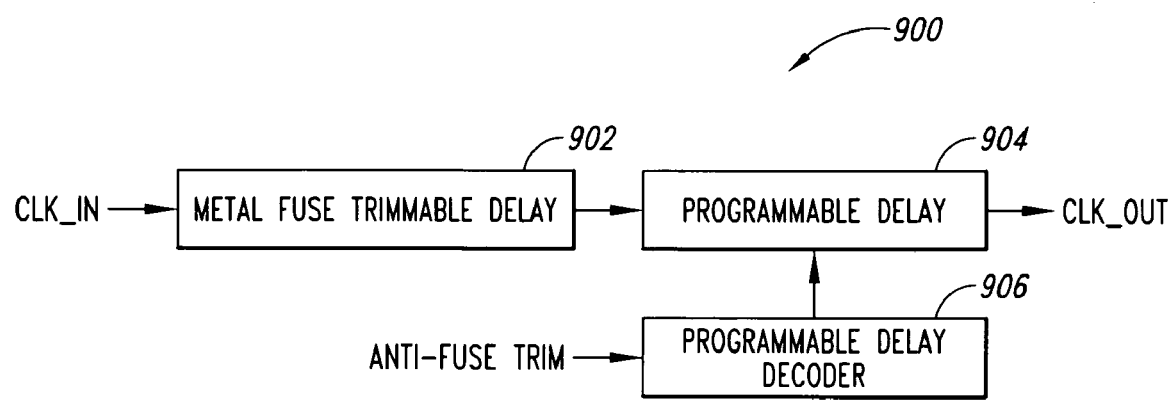
FIG. 7 is a block diagram of an adjustable delay according to an embodiment of the present invention that can be used for the tAC trim and tOH trim circuits.

FIG. 7 illustrates an adjustable delay 900 according to an embodiment of the present invention. The adjustable delay 900 can be substituted for the adjustable delays 520, 522 of the tAC trim circuit 502 and the adjustable delays 530, 532 of the tOH trim circuit 504. The adjustable delay 900 includes a metal fuse trimmable delay 902 and an anti-fuse programmable delay 904. The metal fuse trimmable delay 902 provides a delay that is set by fuse programming. Such fuse programming typically occurs during manufacture of the device. The anti-fuse programmable delay 904 can be programmed at a later stage and can be programmed electrically. The programmable delay 904 provides an adjustable delay controlled by a programmable delay decoder 906. The programmable delay decoder 906 is representative of tAC trim decoder 524 and tOH trim decoder 534, and controls the delay of the programmable delay 904 according to a TRIM signal. The TRIM signal is indicative of a desired trim condition or delay condition. The TRIM signal can be determined at testing and/or controlled by other fuses/antifuses. In alternative embodiments, the TRIM signal is user programmable such as through a mode register. The adjustable delay 900 provides an output clock signal CLK_OUT in response to an input clock signal CLK_IN. The resulting CLK_OUT signal is delayed relative to the CLK_IN signal based on the total delay of the fuse trimmable delay 902 and the programmable delay 904. The two-stage adjustable delay of the adjustable delay 900 provides flexibility to permanently trim a delay to accommodate variations in circuit performance and to further trim the delay by programming to tailor performance according to specific operating conditions, such as specific voltage, temperature, and power conditions.

The tAC and tOH trim circuits according to various embodiments of the invention can be used for a variety of purposes in electronic devices, such as memory devices. For example, with reference to FIG. 8, a SDRAM 800 includes a DLL 10 having a tAC trim circuit 870 and a tAC trim circuit 872 according to embodiments of the present invention. The SDRAM 800 further includes a command decoder 104 that controls the operation of the SDRAM 800 responsive to high-level command signals received on a control bus 806 and coupled through input receivers 808. These high level command signals, which are typically generated by a memory controller (not shown in FIG. 8), are a clock enable signal CKE*, clock signals CLK and CLK*, a chip select signal CS*, a write enable signal WE*, a row address strobe signal RAS*, a column address strobe signal CAS*, and a data mask signal DQM, in which the "*" designates the signal as active low. The command decoder 804 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted. The command decoder 804 also includes a mode register 805 that can be programmed by a user to control the operating modes and operating features of the SDRAM 800.

The SDRAM 800 includes an address register 812 that receives row addresses and column addresses through an address bus 814. The address bus 814 is generally coupled through input receivers 810 and then applied to the memory controller. A row address is generally first received by the address register 812 and applied to a row address multiplexer 818. The row address multiplexer 818 couples the row address to a number of components associated with either of two memory banks 820, 822 depending upon the state of a bank address bit forming part of the row address. Associated with each of the memory banks 820, 822 is a respective row address latch 826, which stores the row address, and a row decoder 828, which decodes the row address and applies corresponding signals to one of the arrays 820 or 822. The row address multiplexer 818 also couples row addresses to the row address latches 826 for the purpose of refreshing the memory cells in the arrays 820, 822. The row addresses are generated for refresh purposes by a refresh counter 830, which is controlled by a refresh controller 832. The refresh controller 832 is, in turn, controlled by the command decoder 804.

After the row address has been applied to the address register 812 and stored in one of the row address latches 826, a column address is applied to the address register 812. The address register 812 couples the column address to a column address latch 140. Depending on the operating mode of the SDRAM 800, the column address is either coupled through a burst counter 842 to a column address buffer 844, or to the burst counter 842 which applies a sequence of column addresses to the column address buffer 844 starting at the column address output by the address register 812. In either case, the column address buffer 844 applies a column address to a column decoder 848.

Figure 8:
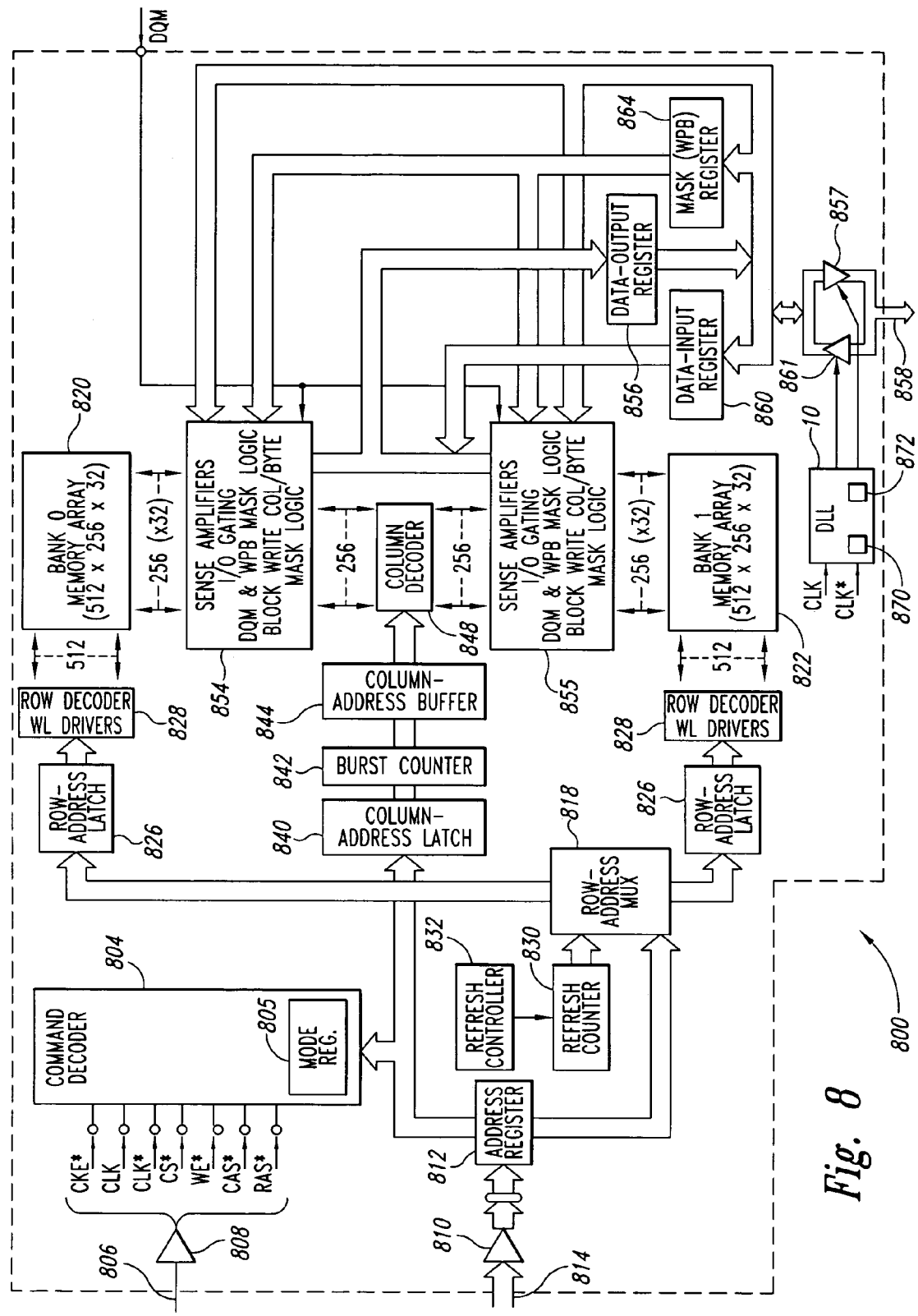
FIG. 8 is a block diagram of a memory device including a delay-locked loop having tAC and tOH trim circuits according to embodiments of the present invention.

Data to be read from one of the arrays 820, 822 is coupled to the column circuitry 854, 855 for one of the arrays 820, 822, respectively. The data is then coupled through a data output register 856 and data output drivers 857 to a data bus 858. The data output drivers 857 apply the read data to the data bus 858 responsive to DCLK, DCLK* signals generated by the DLL 10. The SDRAM 800 shown in FIG. 8 is a double data rate ("DDR") SDRAM that inputs or outputs data twice each clock period. The DLL 10 receives the CLK, CLK* signals and generates the DCLK, DCLK* signals.

Data to be written to one of the arrays 820, 822 are coupled from the data bus 858 through data input receivers 861 to a data input register 860. The data input receivers 861 couple the write data from the data bus 858 responsive to delayed clock signals DCLK, DCLK* generated by the DLL 10. The DLL control circuit 10 receives the CLK, CLK* signals and generates DCLK, DCLK* signals that are used to clock the data output drivers 857 and the data input receivers 861. The write data are coupled to the column circuitry 854, 855 where they are transferred to one of the arrays 820, 822, respectively. A mask register 864 responds to a data mask DM signal to selectively alter the flow of data into and out of the column circuitry 854, 855, such as by selectively masking data to be read from the arrays 820, 822.

Figure 9:
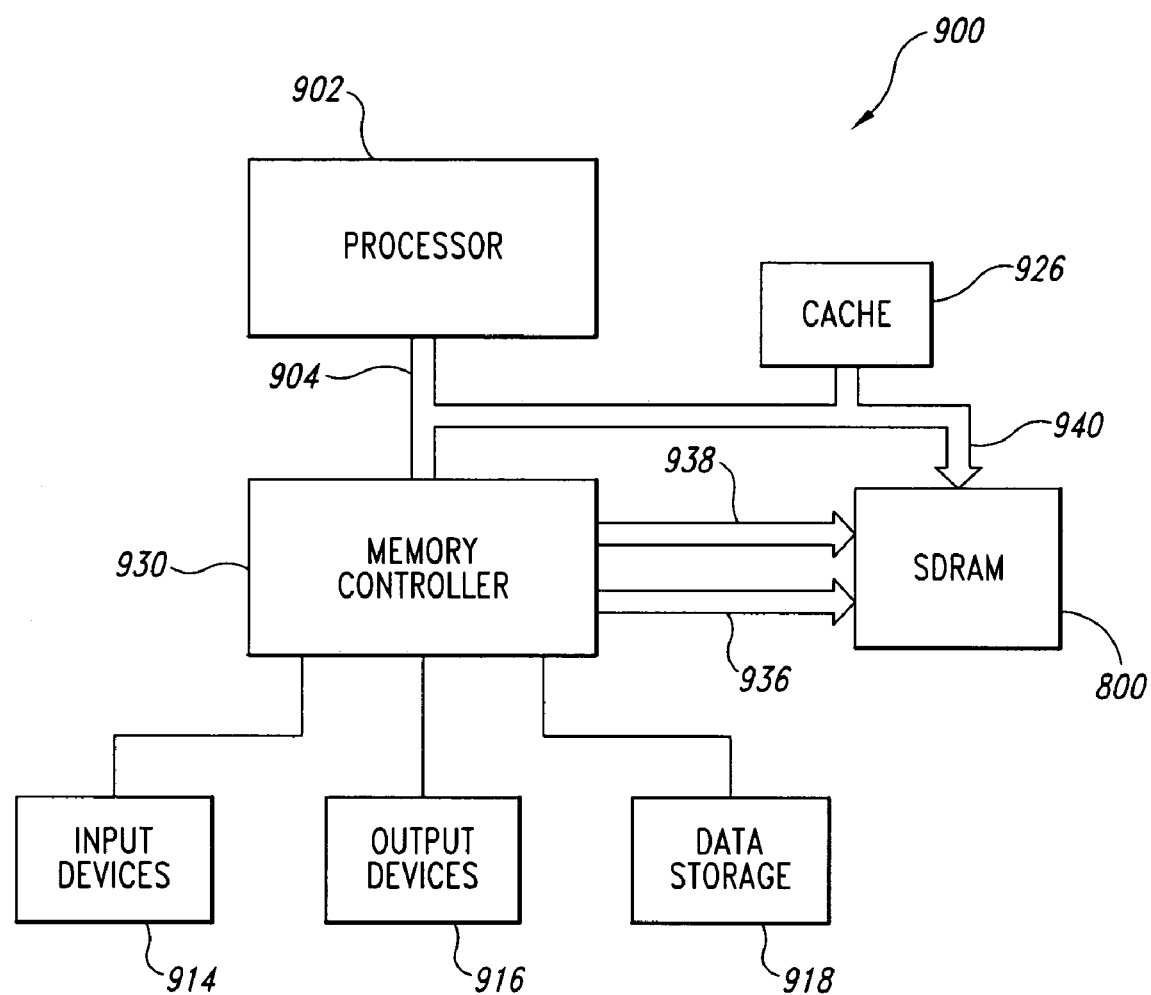
FIG. 9 is a block diagram of a computer system including the memory device of FIG. 8.

The SDRAM 800 shown in FIG. 8 can be used in various electronic systems. For example, it may be used in a processor-based system, such as a computer system 900 shown in FIG. 9. The computer system 900 includes a processor 902 for performing various computing functions, such as executing specific software to perform specific calculations or tasks. The processor 902 includes a processor bus 904 that normally includes an address bus, a control bus, and a data bus. In addition, the computer system 900 includes one or more input devices 914, such as a keyboard or a mouse, coupled to the processor 902 to allow an operator to interface with the computer system 900. Typically, the computer system 900 also includes one or more output devices 916 coupled to the processor 902, such output devices typically being a printer or a video terminal. One or more data storage devices 918 are also typically coupled to the processor 902 to allow the processor 902 to store data in or retrieve data from internal or external storage media (not shown). Examples of typical storage devices 918 include hard and floppy disks, tape cassettes, and compact disk read-only memories ("CD-ROMs"). The processor 902 is also typically coupled to cache memory 926, which is usually static random access memory ("SRAM"), and to the SDRAM 800 through a memory controller 930. The memory controller 930 normally includes a control bus 936 and an address bus 938 that are coupled to the SDRAM 800. A data bus 940 is coupled from the SDRAM 800 to the processor bus 904 either directly (as shown), through the memory controller 930, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A clock signal generator circuit, comprising:
    a delay-locked loop (DLL) having a delay line providing an adjustable delay and a phase detector, the delay line operable to provide a delayed clock signal in response to an input clock signal and the phase detector operable to compare first and second signals and further operable to adjust the delay of the delay line based on the phase of the first and second signals, the delayed clock signal having a phase relative to the phase of the input clock signal that is determined by the delay line, the delayed clock signal being used to provide a feedback clock signal;
    a first adjustable trimming circuit having first and second adjustable delay circuits and operable to delay the input clock signal and the feedback clock signal, respectively, by respective first and second adjustable delays to provide the first and second signals to the phase detector, each of the first and second adjustable delays being set responsive to respective first and second trim control signals to provide respective delays within a range extending from a respective intrinsic delay to a respective maximum delay; and
    a trim decoder coupled to the first adjustable trimming circuit and being configured to be programmed to provide the first and second trim control signals to the first and second adjustable delay circuits, respectively, the trim decoder being programmed so that one of the first and second trim control signals sets its respective adjustable delay at substantially the intrinsic delay of the respective delay circuit while the other of the first and second trim control signals sets its respective adjustable delay to a delay that is less than the maximum delay of the respective delay circuit.

2. The clock signal generator circuit of claim 1 wherein the first and second adjustable delay circuits each comprise:
    a programmable delay having programmable elements and operable to provide a delay programmed in accordance with control signals coupled to the programmable delay.

3. The clock signal generator circuit of claim 2 wherein the programmable elements of the programmable delay comprises at least one of fuses or antifuses.

4. The clock signal generator circuit of claim 1 wherein the DLL further includes an input buffer having an input delay, an output buffer having an output delay, and a model delay having a delay approximately equal to the sum of the input and output delays.

5. The clock signal generator of claim 1 wherein the delayed clock signal comprises a first delayed clock signal and a second delayed clock signals, the first and second delayed clock signals being complementary, the clock signal generator further comprising a second trimming circuit having third and fourth adjustable delay circuits operable to trim an uncorrected duty cycle by delaying the first and second delayed clock signals, respectively, by respective third and fourth adjustable delays to provide first and second output clock signals, respectively.

6. The clock signal generator of claim 5 wherein the second trimming circuit further includes a trim decoder coupled to the third and fourth adjustable delays circuits and operable to adjust the delays of the third and fourth adjustable delays in accordance with a control signal provided thereto.

7. A clock signal generator circuit, comprising:
a delay-locked loop (DLL) having a delay line and a phase detector, the delay line operable to provide a first delayed clock signal in response to a first input clock signal and further operable to provide a second delayed clock signal in response to a second input clock signal, the first and second input clock signals being complementary, the phase detector operable to compare first and second signals and further operable to adjust the delay of the delay line based on the phase of the first and second signals;
an adjustable trimming circuit having first and second adjustable delay circuits and operable to trim an uncorrected duty cycle by delaying the first and second delayed clock signals, respectively, by respective first and second adjustable delays corresponding to respective first and second trim control signals to provide first and second output clock signals, each of the first and second adjustable delays being within a range extending from a respective intrinsic delay to a respective maximum delay, the first input clock signal and the one of the output clock signals being provided to the phase detector as the respective first and second signals; and
a trim decoder coupled to the first adjustable trimming circuit and being configured to be programmed to provide the first and second trim control signals to the first and second adjustable delay circuits, respectively, the trim decoder being programmed so that one of the first and second trim control signals sets the respective adjustable delay at substantially the intrinsic delay of the respective delay circuit while the other of the first and second trim control signals sets its respective adjustable delay to a delay that is less than the maximum delay of the respective delay circuit.

8. The clock signal generator circuit of claim 7 wherein the first and second adjustable delay circuits each comprise:
a programmable delay having programmable elements and operable to provide a delay programmed in accordance with control signals coupled to the programmable delay.

9. The clock signal generator circuit of claim 8 wherein the programmable elements of the programmable delay comprises at least one of fuses or antifuses.

10. The clock signal generator circuit of claim 7 wherein the DLL further includes an input buffer having an input delay, an output buffer having an output delay, and a model delay having a delay approximately equal to the sum of the input and output delays.

11. The clock signal generator of claim 7 wherein the clock signal generator further comprises a second trimming circuit, the second trimming circuit having third and fourth adjustable delay circuits and operable to delay the first input clock signal and a feedback clock signal, respectively, by respective third and fourth adjustable delays to provide the first and second signals, respectively, to the phase detector, the feedback clock signal related to the first delayed clock signal provided by the DLL adjustable delay.

12. The clock signal generator of claim 11 wherein the second trimming circuit further includes a trim decoder coupled to the third and fourth adjustable delay circuits and operable to adjust the delays of the first and second adjustable delays in accordance with a control signal provided thereto.

13. A method for trimming an unadjusted forward delay of a delay-locked loop (DLL), comprising:
adding respective adjustable delays to both a feedback clock signal path and an input clock signal path, each of the adjustable delays varying between a respective minimum delay and a respective maximum delay, the adjustable delays being initially set to the respective minimum delays;
delaying an input clock signal by coupling the input clock signal through the input clock signal path to provide an output clock signal, the magnitude of the first delay being adjusted responsive to a phase control signal, the output clock signal being used to provide the feedback clock signal;
comparing the timing of the feedback clock signal to the timing of the input clock signal to provide the phase control signal; and
after the adjustable delays have been initially set to the respective minimum delays, setting the delay of one of the adjustable delays to a delay that is greater than the respective minimum delay.

14. The method of claim 13 wherein the feedback clock signal path has an adjustable delay through which the feedback clock signal is propagated.

15. A method for trimming a duty cycle of first and second output clock signals provided by a delay-locked loop (DLL), comprising:
delaying a first input clock signal and a complementary second input clock signal by respective first and second adjustable delays to provide a first delayed input clock signal and a second delayed input clock signal;
delaying the first delayed input clock signal and the second delayed input clock signal by a respective third and fourth adjustable delays, each of the third and fourth adjustable delays varying between a respective minimum delay and a respective maximum delay;
setting one of the third and fourth adjustable delays to substantially the respective minimum delay;
while the delay of one of the third and fourth delayed input clock signals remains set at the respective minimum delay, setting the adjustable delay of the other of the first and second delayed input clock signals to a delay that is greater than the respective minimum delay but less than the respective maximum delay; and
using the first and second delayed input clock signals to provide the first and second output clock signals.

16. A method for trimming an unadjusted forward delay of a delay-locked loop (DLL), comprising:
coupling an input clock signal through an input clock signal path to provide an output clock signal, the input clock signal path having a first adjustable delay that varies between a respective minimum delay and a respective maximum delay;
coupling a signal derived from the output clock signal through a feedback clock signal path to provide a feedback clock signal, the feedback clock signal path having a second adjustable delay that varies between a respective minimum delay and a respective maximum delay;

comparing the timing of the feedback clock signal to the timing of the input clock signal;

adjusting the delay of the input clock signal path based on the comparison of the timing of the feedback clock signal to the timing of the input clock signal; and setting one of the first and second adjustable delays to the respective minimum delay while the other of the first and second adjustable delays is set to a delay that is less than the respective maximum delay.

17. The method of claim 16 wherein the first and second adjustable delays are initially set at the respective minimum delays.

* * * * *

UNITED STATES PATENT AND TRADEMARK OFFICE
CERTIFICATE OF CORRECTION

| | | |
|---|---|---|
| PATENT NO. | : 7,671,647 B2 | Page 1 of 1 |
| APPLICATION NO. | : 11/341774 | |
| DATED | : March 2, 2010 | |
| INVENTOR(S) | : Tyler Gomm et al. | |

It is certified that error appears in the above-identified patent and that said Letters Patent is hereby corrected as shown below:

In column 13, line 16, in Claim 6, delete "delays" and insert -- delay --, therefor.

In column 14, line 45, in Claim 15, after "by" delete "a".

Signed and Sealed this

Eighteenth Day of May, 2010

David J. Kappos
*Director of the United States Patent and Trademark Office*